United States Patent
Jenq et al.

[11] Patent Number: 6,153,465
[45] Date of Patent: Nov. 28, 2000

[54] METHOD OF FABRICATING A CAPACITOR OF DYNAMIC RANDOM ACCESS MEMORY

[75] Inventors: Jason Jenq, Pingtung; Sun-Chieh Chien, Hsinchu, both of Taiwan

[73] Assignee: United Microelectronics Corp., Hsin-Chu, Taiwan

[21] Appl. No.: 09/008,863

[22] Filed: Jan. 20, 1998

[30] Foreign Application Priority Data

Dec. 1, 1997 [TW] Taiwan ................................ 86118028

[51] Int. Cl.$^7$ .............................................. H01L 21/8242
[52] U.S. Cl. ........................................... 438/255; 438/398
[58] Field of Search ..................... 438/253–256, 438/396–399

[56] References Cited

U.S. PATENT DOCUMENTS

| 5,447,878 | 9/1995 | Park et al. . |  |
|---|---|---|---|
| 5,554,557 | 9/1996 | Koh . |  |
| 5,650,351 | 7/1997 | Wu . |  |
| 5,726,085 | 3/1998 | Crenshaw et al. | 438/255 |
| 5,874,336 | 2/1999 | Cherng | 438/255 |

*Primary Examiner*—Jey Tsai
*Attorney, Agent, or Firm*—Rabin & Champagne, P.C.

[57] ABSTRACT

A method of fabricating a capacitor of a dynamic random access memory is provided. A substrate is first provided, wherein a first dielectric layer is formed on the substrate, and a via is formed through the first dielectric layer to expose one of source/drain regions. A conductive material is formed on the first dielectric layer so that the conductive material is filled in the via to contact with the one of the source/drain regions. The conductive material is patterned to form a first conductive layer. A hemispherical polysilicon grain layer is formed at least on the first conductive layer. The hemispherical polysilicon grain layer is etched back so that the first conductive layer and the hemispherical polysilicon grain layer together form a lower electrode. A second dielectric layer is formed on the lower electrode. A second conductive layer is formed on the second dielectric layer to be an upper electrode.

14 Claims, 5 Drawing Sheets

METHOD OF FABRICATING A CAPACITOR OF DYNAMIC RANDOM ACCESS MEMORY

CROSS-REFERENCE TO RELATED APPLICATION

This application claims the priority benefit of Taiwan application serial no. 86118028, filed Dec. 1, 1997, the full disclosure of which is incorporated herein by reference.

BACKGROUND OF THE INVENTION

1. Field of the Invention

The invention relates in general to the fabrication of a dynamic random access memory (DRAM), and more particular to the fabrication of a DRAM capacitor with a larger surface area to increase its cell capacitance.

2. Description of the Related Art

A single DRAM cell includes a metal oxide semiconductor (MOS) transistor and a capacitor. The capacitor is the heart area for storing signals. If the capacitor stores larger amount of charges, the influence of noise as data writing and reading becomes less and also the frequency of refresh decreases. Methods for increasing the charge storage ability of the capacitor includes: (1) increasing the surface area of the capacitor to increase the number of charges stored in the capacitor; (2) selecting proper dielectric material with high dielectric constance to increase the number of stored charges per area; and (3) reducing the thickness of the dielectric layer but the technique of fabricating a thin dielectric layer is rather limited.

Referring to FIG. 1, showing a circuit diagram of a DRAM cell, a memory cell is composed of a MOS transistor T and a storage capacitor C. Source region of the MOS transistor T is coupled to a corresponding bit line BL, drain region of it is coupled to a storage electrode 15 of the storage capacitor C, gate region of it is coupled to a corresponding word line WL. An opposed electrode 14 of the storage capacitor C is coupled to a fixed voltage source. A dielectric layer 1 2 is deposited between the storage electrode 15 and the opposed electrode 14.

Conventionally, hemispherical grain polysilicon (HSG) is frequently utilized for the fabricating of a lower electrode of a DRAM capacitor to increase the surface area of a electrode plate. Referring to FIGS. 2A to 2E, these figures illustrate the fabrication method of a conventional DRAM. Referring first to FIG. 2A, the MOS device and the silicon substrate 20 under the insulating layer 22 are only partially illustrated. The insulating layer 22, such as an inter-polysilicon dielectric layer (IPD) 22, can be used to isolate from other devices. There is a via at the IPD layer 22, exposing the source/drain regions (not shown) of the MOS device. A conductive material 24, such as doped polysilicon, is then used to fill the via and cover the IPD layer 22.

Referring to FIG. 2B, on the surface of the conductive layer 24, a HSG layer 26 is formed by plasma enhanced chemical vapor deposition (PECVD), using tetra-ethylorthosilicate (TEOS) as gas source. Next, the HSG layer 26 is doped with impurities by ion implantation to increase its conductivity. Due to the formation of a native oxide layer on the surface of the HSG layer 26, during the process of forming the HSG layer 26, the quality of the capacitor is seriously influenced. Therefore, the chip is dipped in etchant such as RCA-HF to remove the native oxide layer on the surface of the HSG layer 26, wherein the RCA etchant includes $NH_4OH$, hot deionized water (HDIW) and $H_2O_2$.

Referring to FIG. 2C, a photoresist layer 28 is formed on the HSG layer 26 to define a lower electrode.

Referring next to FIG. 2D, the HSG layer 26 and the conductive layer 24 are etched, using the photoresist layer 28 as a mask. After the removal of the photoresist layer 28, the patterned conductive layer 24 and HSG layer 26 together form the lower electrode 25 of the capacitor.

Referring to FIG. 2E, a dielectric layer 32 is deposited to cover the lower electrode 25. The dielectric layer 32 can be a triple layer structure such as a silicon oxide/silicon nitride/silicon oxide layer, a double layer structure such as a silicon nitirde/silicon oxide layer or $Ta_2O_5$. Finally, an upper electrode 34 is deposited.

A conventional lower electrode with a top-HSG layer has a cell capacitance for about only 1.7 times larger than a lower electrode without a top-HSG layer.

SUMMARY OF THE INVENTION

It is therefore an object of the invention to provide a method of fabricating an DRAM cell with larger surface area to increase the cell capacitance. The present invention provides a method to form hemispherical grains at the periphery of the capacitor to overcome the limitation of photo-resolution.

A method of fabricating a capacitor of a dynamic random access memory is provided. A substrate is first provided, wherein a first dielectric layer is formed on the substrate, and a via is formed through the first dielectric layer to expose one of source/drain regions. A conductive material is formed on the first dielectric layer so that the conductive material is filled in the via to contact with the one of the source/drain regions. The conductive material is patterned to form a first conductive layer. A hemispherical polysilicon grain layer is formed at least on the first conductive layer. The hemispherical polysilicon grain layer is etched back so that the first conductive layer and the hemispherical polysilicon grain layer together form a lower electrode. A second dielectric layer is formed on the lower electrode. A second conductive layer is formed on the second dielectric layer to be an upper electrode.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
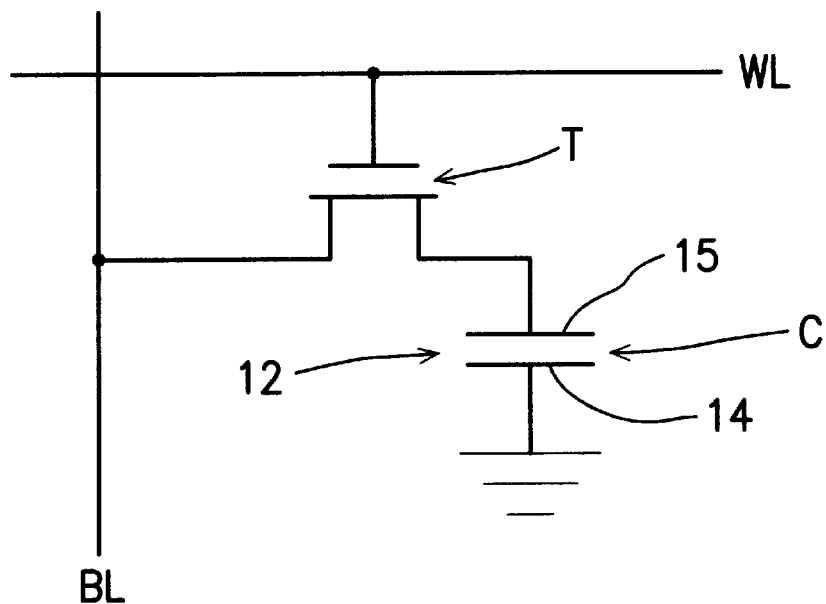
FIG. 1 is a circuit diagram of a DRAM memory cell.
Figure 2A:
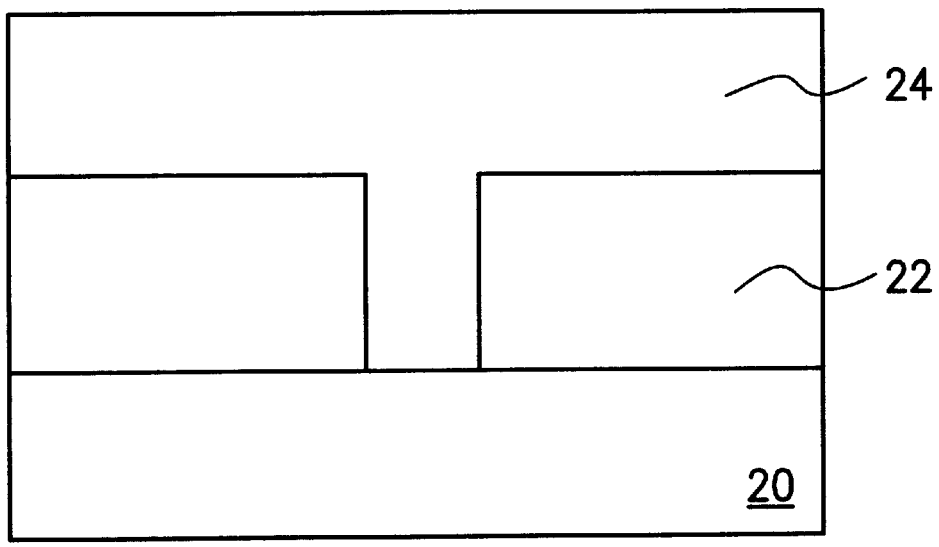
FIGS. 2A to 2E are cross-sectional views showing the process flow of fabricating a conventional DRAM.
Figure 2B:
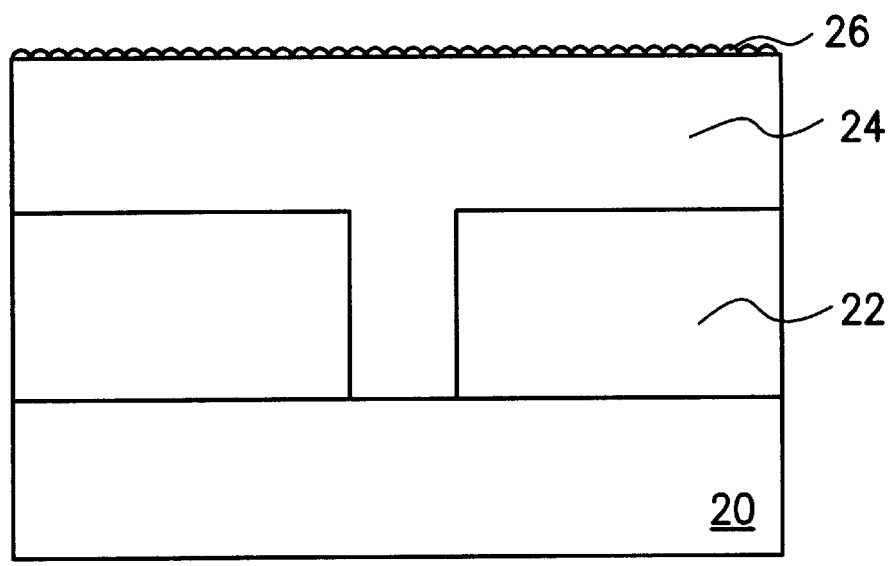
Figure 2C:
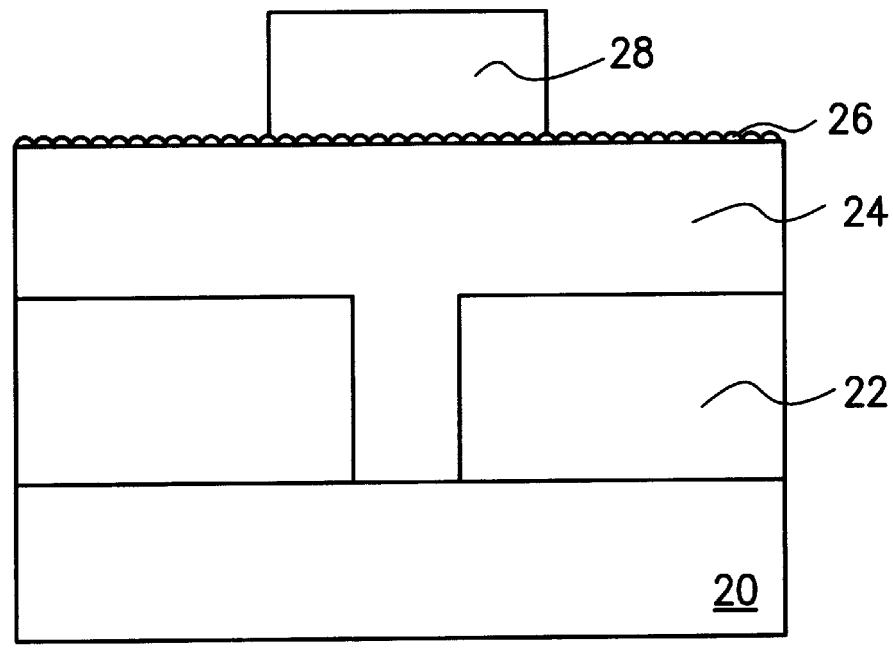
Figure 2D:
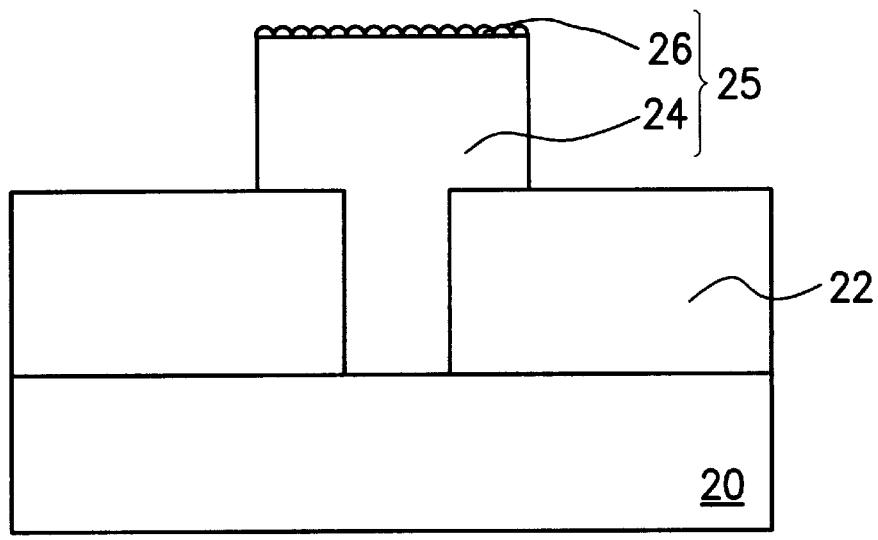
Figure 2E:
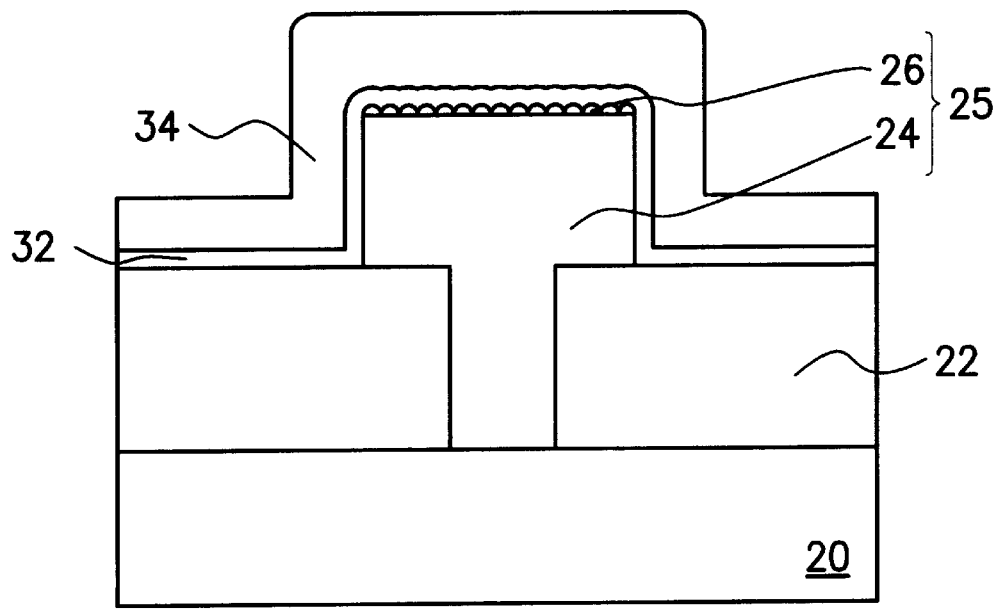
Figure 3A:
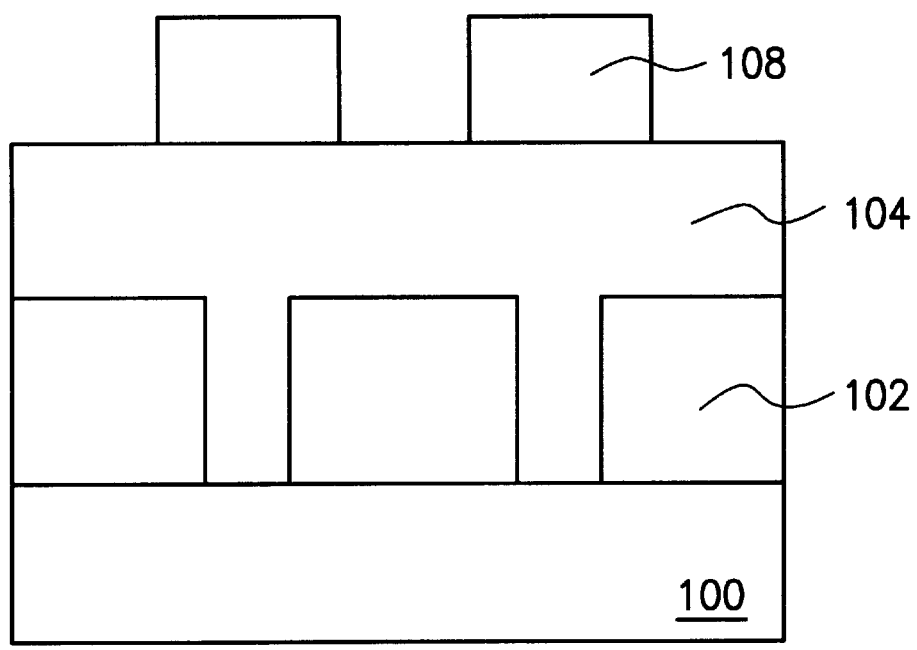
FIGS. 3A to 3D are cross-sectional views showing the process flow of fabricating a DRAM according to a preferred embodiment of the invention.

First, referring to FIG. 3A, the MOS device and the silicon substrate 100 under the insulating layer 102 are only partially illustrated. The insulating layer 102, such as an inter-polysilicon dielectric layer (IPD) 102, can be used to isolate from other devices. There is a via at the IPD layer 102, exposing the source/drain regions (not shown) of the MOS device. A conductive material 104, such as doped polysilicon, is then used to fill the via and cover the IPD layer 102. A photoresist mask 108 is then formed on the conductive layer 104.

Figure 3B:
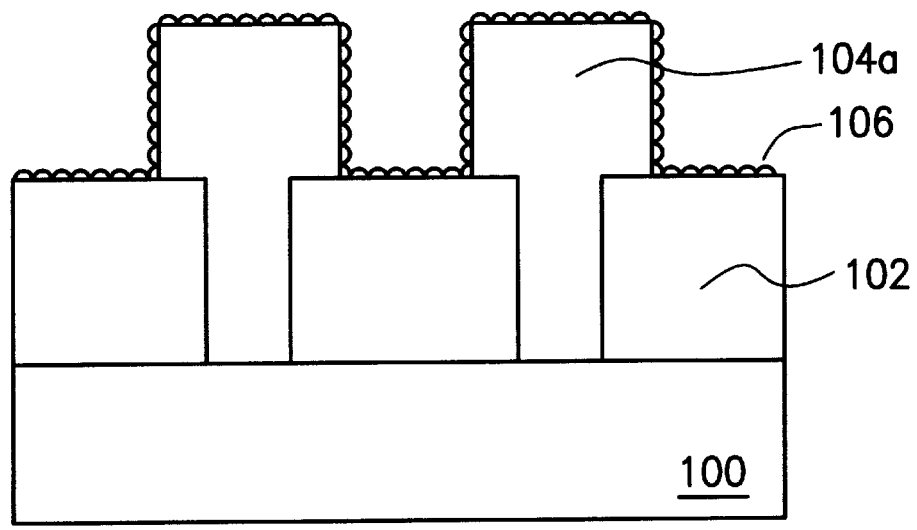

Referring to FIG. 3B, the conductive layer 104 is etched, using the photoresist mask 108. The photoresist mask 108 is then removed. A HSG layer 106 is formed over the conductive layer 104a and the partially exposed surface of the IPD layer 102, by, for example, PECVD, using TEOS as gas source. Due to the superior step coverage of the TEOS, HSG can also be formed at the periphery of the conductive layer 104a. Impurities can also be doped into the HSG layer 106 by ion implantation to increase its conductivity. During the formation of the HSG layer 106, a native oxide layer will be formed on the surface, which influences the quality of the capacitor. The chip is further dipped in the RCA-HF etchant to remove the native oxide layer on the surface of the HSG layer 106. The RCA-HF etchant includes $NH_4OH$, hot deionized water (HDIW) and $H_2O_2$.

Figure 3C:
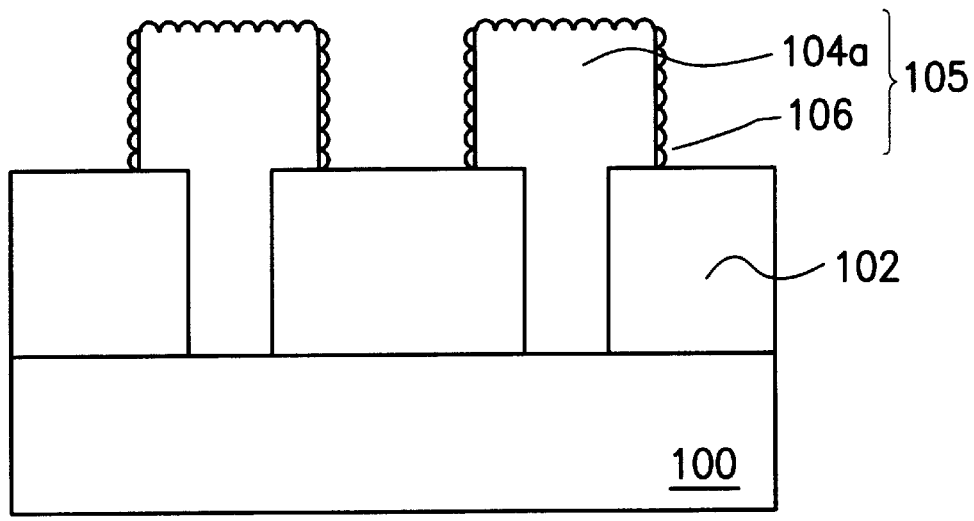

Next, referring to FIG. 3C, to prevent the undesirded short between the two electrodes, a portion of the HSG layer 106 in the concave of the conductive layer 104a is removed to expose the IPD layer 102, by dry etching back the HSG layer 106. Another portion of the HSG layer 106 on the top surface of the conductive layer 104a is simultaneously removed. The retained top surface of the conductive layer 104a becomes HSG-like rugged after the etching process. The conductive layer 104a and the HSG layer 106 together form the lower electrode 105. The rugged top surface of the conductive layer 104a provides substantially equal surface area as the original HSG layer. The dry etching back process includes at least three steps: break through, main etching, and over etching. The break through step is performed at a pressure of 60 mT, with $Cl_2$ gas flow of 70 sccm, providing an electric power of 300 W for about 10 seconds. The main etching step is performed at a pressure of 60 mT, with $Cl_2$ gas flow of 70 sccm and HBr gas flow of 30 sccm, providing an electric power of 30 W for about 20 seconds. The over etching step is performed at a pressure of 120 mT, with $Cl_2$ as flow of 20 sccm, HBr gas flow of 70 sccm and $He-O_2$ gas flow of 6 sccm, providing an electric power of 225 W for about 15 seconds.

Figure 3D:
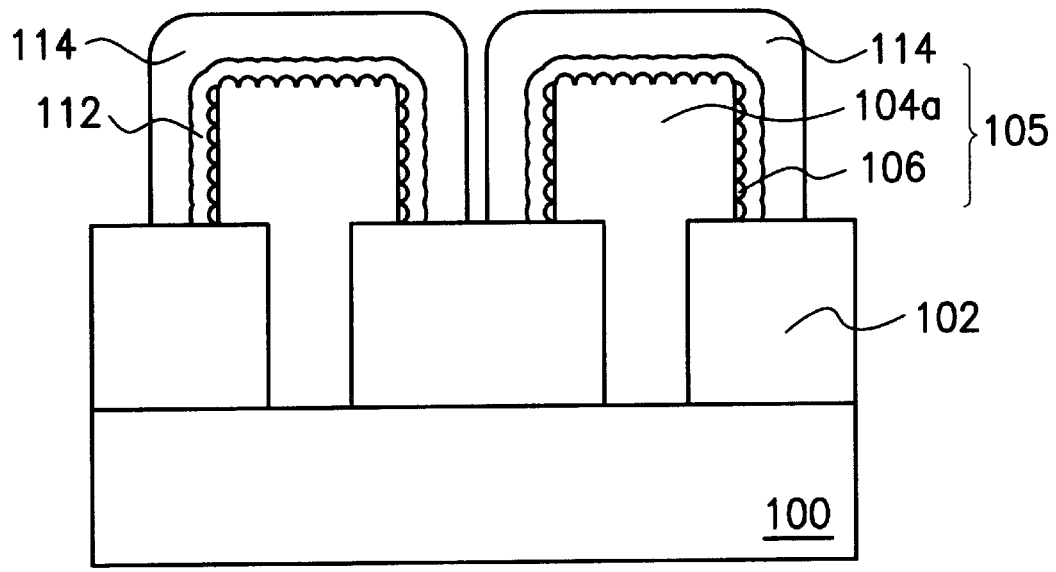

Referring to FIG. 3D, conventional processes are further performed. A dielectric layer 112 is deposited to cover the lower electrode 105. The dielectric layer 112 can be a triple layer structure such as silicon oxide/silicon nitride/silicon oxide layer (ONO), a double layer structure such as silicon nitride/silicon oxide layer (NO) or $Ta_2O_5$. An upper electrode 114 is then formed on the dielectric layer 112.

The present invention provides a method to form a DRAM cell with larger surface area at least at the lower electrode. Therefore the number of charges stored in the capacitor increases because of the additional HSG layer at the periphery of the lower electrode. The cell capacitance of the capacitor according to the preferred embodiment of the invention is about 3 times larger than the one of the conventional capacitor with similar main structure but without the HSG layer as a surface layer. The method of the invention also overcomes the limitation of the photo-resolution.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a capacitor of a dynamic random access memory, comprising the steps of:

providing a substrate, wherein a first dielectric layer is formed on the substrate, and a via is formed through the first dielectric layer to expose one of source/drain regions;

forming a conductive material on the first dielectric layer so that the conductive material fills the via to contact the one of the source/drain regions;

patterning the conductive material to form a first conductive layer;

forming a hemispherical polysilicon grain layer at least on the first conductive layer;

performing three etching steps including a break-through etching, a main etching, and an overetching, under respective first, second and third different conditions, to etch back the hemispherical polysilicon grain layer so that the first conductive layer and the hemispherical polysilicon grain layer together form a lower electrode;

forming a second dielectric layer on the lower electrode; and forming a second conductive layer as an upper electrode on the second dielectric layer.

2. A method as claimed in claim 1, wherein the conductive material includes doped polysilicon.

3. A method as claimed in claim 1, wherein the hemispherical polysilicon grain layer is formed by plasma enhanced chemical vapor deposition, using tetra-ethyl-ortho-silicate (TEOS) as gas source.

4. A method as claimed in claim 1, wherein the hemispherical polysilicon grain layer is etched back by dry etching.

5. A method as claimed in claim 1, wherein the hemispherical polysilicon grain layer is etched back to expose the first dielectric layer.

6. A method as claimed in claim 1, wherein the conditions of the break-through etching include a pressure of 60 mT, a $Cl_2$ gas flow of 70 sccm, and an electric power of 300 W for about 10 seconds.

7. A method as claimed in claim 1, wherein the conditions of the main etching include a pressure of 60 mT, a $Cl_2$ gas flow of 70 sccm, an HBr gas flow of 30 sccm, and an electric power of 300 W for about 20 seconds.

8. A method as claimed in claim 1, wherein the conditions of the over-etching include a pressure of 120 mT a $Cl_2$ gas flow of 20 sccm, an HBr gas flow of 70 sccm, an $He-O_2$ gas flow of 6 sccm, and an electric power of 225 W for about 15 seconds.

9. A method as claimed in claim 1, wherein the second dielectric layer is a silicon oxide/silicon nitride/silicon oxide layer triple layer structure.

10. A method as claimed in claim 1, wherein the second dielectric layer is a silicon nitride/silicon oxide double layer structure.

11. A method as claimed in claim 1, wherein the second dielectric layer is $Ta_2O_5$.

12. A method as claimed in claim 1, wherein the main etching has a duration greater than a duration of the break-through etching, and the over-etching and is performed in an environment that includes flows of two different gases, and wherein the third etching step is performed in an environment that includes flows of three different gases and is at a higher pressure than environments of the break-through etching and main etching steps.

13. A method of fabricating a capacitor of a dynamic random access memory, comprising the steps of:

providing a substrate, wherein a first dielectric layer is formed on the substrate, and a via is formed through the first dielectric layer to expose one of a plurality of source/drain regions;

forming a conductive material on the first dielectric layer so that the conductive material is filled in the via to contact with the one of the source/drain regions;

patterning the conductive material to form a first conductive layer;

forming a hemispherical polysilicon grain layer at least on the first conductive layer;

performing a break through step on the hemispherical polysilicon grain layer, wherein the break through step is performed at a pressure of 60 mT, with a $Cl_2$ gas flow of 70 sccm, and providing 300 W of electric power for about 10 seconds;

performing a main etching step on the hemispherical polysilicon grain layer, wherein the main etching step is performed at a pressure of 60 mT, with a $Cl_2$ gas flow of 70 sccm and a HBr gas flow of 30 sccm, and providing 300 W of electric power for about 20 seconds;

performing an over-etching step on the hemispherical polysilicon grain layer so that the first conductive layer and the hemispherical polysilicon grain layer together form a lower electrode, wherein the over-etching step is performed at a pressure of 120 mT, with a $Cl_2$ gas flow of 20 sccm, a HBr gas flow of 70 sccm, and a He—$O_2$ gas flow of 6 sccm, and providing 225 W of electric power for about 15 seconds;

forming a second dielectric layer on the lower electrode; and forming a second conductive layer on the second dielectric layer to be an upper electrode.

14. A method of fabricating a capacitor of a dynamic random access memory, comprising the steps of:

providing a substrate, wherein a first dielectric layer is formed on the substrate, and a via is formed through the first dielectric layer to expose one of a plurality of source/drain regions;

forming a conductive material on the first dielectric layer so that the conductive material fills the via to contact the one of the source/drain regions;

patterning the conductive material to form a first conductive layer;

forming a hemispherical polysilicon grain layer at least on the first conductive layer;

successively performing break through etching, main etching and over-etching, including performing the break through etching on the hemispherical polysilicon grain layer at a first pressure, with a $Cl_2$ gas flow at a first rate, and with application of electric power of a first wattage for a first duration, then performing the main etching on the hemispherical polysilicon grain layer at a second pressure, with a $Cl_2$ gas flow at a second rate flow and a flow of another gas at a third rate, and with application of electric power of a second wattage for a second duration greater that the first duration, and then performing the over-etching on the hemispherical polysilicon grain layer at a third pressure greater than the first and second pressures, with a $Cl_2$ gas flow at a fourth rate, a flow a different gas at a fifth rate ad a flow of still different gas at a sixth rate, and with application of electric power of a third wattage lower than the first and second wattages for a third duration less than the second duration, so that the first conductive layer and the hemispherical polysilicon grain layer together form a lower electrode;

forming a second dielectric layer on the lower electrode; and forming a second conductive layer as an upper electrode on the second dielectric layer.

* * * * *